United States Patent
Hinterberger et al.

(10) Patent No.: US 10,991,995 B2
(45) Date of Patent: Apr. 27, 2021

(54) METHOD FOR OPERATING A BATTERY OF AN AT LEAST PARTIALLY ELECTRICALLY OPERATED/DRIVEN FUNCTIONAL DEVICE, CORRESPONDING BATTERY, AND FUNCTIONAL DEVICE

(71) Applicant: AUDI AG, Ingolstadt (DE)

(72) Inventors: Michael Hinterberger, Großmehring (DE); Berthold Hellenthal, Schwanstetten (DE); Tamas Gyulai, Pfaffenhofen an der Ilm (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/782,407

(22) Filed: Feb. 5, 2020

(65) Prior Publication Data

US 2020/0266500 A1 Aug. 20, 2020

(30) Foreign Application Priority Data

Feb. 18, 2019 (DE) .................... 10 2019 202 155.7

(51) Int. Cl.
*H01M 10/48* (2006.01)
*G01R 31/385* (2019.01)
(Continued)

(52) U.S. Cl.
CPC ........ *H01M 10/486* (2013.01); *G01R 31/385* (2019.01); *G01R 31/396* (2019.01); *H01M 10/4257* (2013.01); *H01M 2220/20* (2013.01)

(58) Field of Classification Search
CPC ........... H01M 10/486; H01M 2220/20; H01M 10/4257; G01R 31/396; G01R 31/385; G06F 19/00; H01L 41/1136
(Continued)

(56) References Cited

U.S. PATENT DOCUMENTS

| 4,564,798 A * | 1/1986 | Young ............... H02J 7/007188 320/103 |
| 8,987,935 B2 | 3/2015 | King |
| 2015/0236533 A1* | 8/2015 | Yamamoto ............. H02J 7/025 320/108 |

FOREIGN PATENT DOCUMENTS

| DE | 102012212872 A1 | 1/2013 |
| DE | 102012221076 A1 | 5/2014 |

(Continued)

OTHER PUBLICATIONS

German Examination Report dated Nov. 29, 2019 in corresponding German Application No. 102019202155.7; 24 pages; Machine translation attached.

*Primary Examiner* — Melissa J Koval
*Assistant Examiner* — Trung Q Nguyen
(74) *Attorney, Agent, or Firm* — Maier & Maier, PLLC (57) ABSTRACT

A method for operating a battery of an at least partially electrically operated/driven functional device, a corresponding battery, and a corresponding functional device. A control unit of the battery receives measurement signals relating to a respective parameter of the battery cells from a plurality of switchable battery cells of the battery. The control unit prepares a location-resolved distribution function of the respective cell parameter within the battery on the basis of the measurement signals. By activating the switching elements of the switchable battery cells according to a predetermined switching rule, the control unit produces a pattern of battery cells switched to active and passive. A predetermined location-resolved distribution function of the respective cell parameter is fulfilled and at least one predetermined secondary condition relating to an operation of the functional device and/or the battery is maintained.

9 Claims, 5 Drawing Sheets

(51) Int. Cl.
*H01M 10/42* (2006.01)
*G01R 31/396* (2019.01)

(58) Field of Classification Search
USPC ............... 324/500, 600, 764.01, 103 R, 771,
324/761.01, 501, 639, 642, 702, 76.11,
324/76.66, 96
See application file for complete search history.

(56) References Cited

FOREIGN PATENT DOCUMENTS

DE 102015002072 A1 8/2016
WO 2018109744 A1 6/2018

\* cited by examiner

METHOD FOR OPERATING A BATTERY OF AN AT LEAST PARTIALLY ELECTRICALLY OPERATED/DRIVEN FUNCTIONAL DEVICE, CORRESPONDING BATTERY, AND FUNCTIONAL DEVICE

FIELD

The disclosure relates to a method for operating a battery of an at least partially electrically operated/driven functional device, wherein the battery comprises multiple electrically interconnected switchable battery cells.

BACKGROUND

A switchable battery cell in the meaning of the invention is a battery cell which comprises at least one switching element. The switching element is used to incorporate the switchable battery cell in an electrically conductive matter into a circuit of a battery, or to switch the battery cell out of such a circuit. The switchable battery cell can thus be switched to active and passive with the aid of the at least one switching element.

In addition to the at least one switching element, each of the switchable battery cells of the battery according to the invention comprises a monitoring unit, which in turn comprises at least one measuring unit for measuring a respective operating value or cell parameter of a respective battery cell. A cell parameter can relate in this case, for example, to a charge state and/or an aging state and/or a temperature of a respective battery cell. According to the method according to the invention, the respective measuring unit transmits a measurement signal relating to the respective cell parameter to the monitoring unit. The monitoring unit can be, for example, a microcontroller and can relay the respective measurement signal to a control unit of the battery. The combination of monitoring unit and switchable battery cells is also referred to as smart cells.

Batteries, for example, for use in at least partially electrically driven motor vehicles, which comprise a plurality of individual battery cells, are well known. Various devices are also known which enable individual battery cells to be switched out of a battery, for example, if they should become defective. Methods for operating such batteries are also known.

DE 10 2012 212 872 A1, for example, discloses a method for electrically charging a vehicle battery in such a way that inadequately charged battery cells of the battery are charged and simultaneously excessively charged battery cells are bypassed. The goal in this case is to increase the overall efficiency of the charging. A respective battery cell or a plurality of respective battery cells disadvantageously cannot be switched to active and passive as desired in this case, but rather only when a cell voltage of a respective battery cell exceeds a component-related breakthrough voltage of an installed Zener diode.

U.S. Pat. No. 8,987,935 B2 discloses a classic application of switchable battery cells: a battery for an electric motor vehicle and a method for its operation are described, wherein defective battery cells of the battery can be bypassed by means of activation of a bypass switch, while the remaining battery cells of the battery can still provide a power corresponding to the power requirement of the electric motor of the motor vehicle.

WO 2018/109744 A1 discloses an intelligent battery (smart battery) comprising a plurality of battery cells and a peripheral circuit which is connected to the plurality of battery cells. The smart battery moreover includes a monitoring unit, which is connected to the plurality of battery cells in the peripheral circuit and is oriented to triggering a service request when a maintenance measure or a service has to be performed on the battery.

The cited prior art generally disadvantageously focuses on the monitoring of a state or a behavior of individual battery cells or cell regions. Thus, the classic application examples for operating batteries having multiple switchable battery cells generally describe, for example, measures which necessarily induce inhomogeneities relating to one or more cell parameters within a battery cell composite or within the entire battery by individual battery cells being bypassed or deactivated.

SUMMARY

The invention is therefore based on the object of providing a method for operating a battery of an at least partially electrically driven functional device, wherein utilizing the known advantages of switchable battery cells, an operating value distribution or cell parameter distribution which is optimum according to a predetermined target specification is achieved within the battery.

A method for operating a battery of an at least partially electrically driven functional device is provided by the invention. The battery comprises multiple electrically interconnected switchable battery cells. Each of the switchable battery cells comprises at least one switching element for alternately switching to active and switching to passive the respective battery cell. A switching element can be, for example, a semiconductor switching element, i.e., for example, based on at least one transistor. The at least one switching element can be integrated into the wet region or the dry region of a respective battery cell in this case. For example, it can be provided that the at least one switching element is arranged in a cell branch connecting electrical terminals of the respective battery cell. Alternatively or additionally, it can be provided that the at least one or at least one further switching element is arranged in a bypass branch bypassing a respective galvanic cell of a respective battery cell. By opening and closing the at least one switching element, accordingly an electric current can be produced/switched on and interrupted/switched off in a respective battery cell.

According to the invention, a respective battery cell additionally comprises a monitoring unit having a measuring unit for measuring a respective operating value or cell parameter. A monitoring unit can be a microcontroller in this case, for example. A measuring unit can be a current sensor and/or voltage sensor and/or temperature sensor. A respective cell parameter can be, for example, a respective charge state and/or aging state and/or a respective temperature of a respective battery cell. The monitoring unit is designed to relay the respective measurement signal to a control unit of the battery. This can take place, for example, via a communication terminal of the monitoring unit. Such a communication terminal can be designed, for example, to establish a wireless communication between the monitoring unit and the control unit. Alternatively thereto, it is possible that the communication takes place in a wired manner, for example, via a communication bus. For the case in which the functional device according to the invention is an at least partially electrically driven motor vehicle, the control unit can control, steer, and/or manage in another manner, for example, specific operations or functions of the motor vehicle. The control unit can also comprise a storage unit, which comprises an arbitrary type of a suitable electronic storage means, by means of which, for example, measurement signals transmitted by the monitoring unit can be stored and/or processed.

The method according to the invention provides that the control unit receives the respective measurement signal and, based on the plurality of the measurement signals of the battery cells, prepares a respective distribution function of the respective cell parameter type which is location-resolved over all battery cells of the battery, i.e., for example, a distribution function for each of the temperature and/or the charge state and/or the idle voltage and/or the wear value (SoH—State of Health). In other words, the control unit processes the respective measurement signals of the battery cells received thereby to form a type of virtual map of the battery. On this virtual map, the respective measurement signals received by the control unit from the respective battery cells are represented according to the local position of a respective battery cell in the battery cell composite of the battery. Such a cell parameter distribution can be considered as a virtual landscape, wherein low values of a respective cell parameter correspond to a valley and high values correspond to a peak. The technical equivalent can be implemented, for example, by each present cell parameter being stored as a value in one memory per location of the distribution function, i.e., per battery cell.

The method according to the invention provides that the control unit produces a respective switching configuration for establishing battery cells switched to active and passive by activating the switching elements of the battery cells according to a predetermined switching rule. The switching rule prescribes in this case that by producing the respective switching configuration, i.e., by producing a respective pattern of battery cells switched to active and passive, a predetermined location-resolved distribution function of the respective cell parameter, i.e., a target distribution function is fulfilled and at least one predetermined secondary condition relating to an operation of the functional device and/or the battery is maintained. A secondary condition can be, for example, that a construction-related maximum permissible cell current of a respective battery cell is maintained, and/or a minimal or maximal permitted charge state of a respective battery cell is maintained, and/or a temperature of a respective battery cell is within a predetermined value range, and/or a power requirement placed on the battery is met or maintained. For the case in which the functional device is an at least partially electrically driven motor vehicle, the power requirement can be placed on the battery by the electric motor of the vehicle.

The advantage results due to the invention that utilizing the switchable battery cells and in consideration of greatly varying demands placed on the battery in the form of the at least one secondary condition, an ideal cell parameter distribution in the sense of the respective target distribution function is nonetheless achieved in the battery. Therefore, for example, an aging behavior of the battery cells which is improved in relation to known methods may be achieved. The respective fundamental target distribution function can specify a location-resolved value distribution of target values or can specify an interval of permissible values for each location of the location-resolved value distribution.

The invention also includes embodiments by way of which additional advantages result.

One advantageous embodiment of the method according to the invention provides that the control unit adapts the respective switching configuration according to the predetermined switching rule adaptively to a change of the respective measurement signal. In this way, an error between the actually measured and the predetermined (target) distribution function is reduced. A respective measurement signal can specify, for example, a temperature value of a respective battery cell. The plurality of respective temperature measured values of the battery cells can be received by the control unit and processed to form a virtual or imaginary map of the battery, on which the different temperature values can form valleys (lower values) or peaks (higher values). To now arrive at a predetermined temperature distribution, to thus achieve a predetermined topography on said imaginary map, the control unit activates the switching elements of the battery cells according to a predetermined switching rule. Active and passive battery cells are established by the activation, wherein an active battery cell has a higher temperature due to its operation than a battery cell switched to passive.

A respective measurement signal for a cell parameter, for example, a temperature value, is thus not a constant value, but rather is subjected to changes. Accordingly, a deviation necessarily results between an actually measured and a predetermined distribution function, wherein the deviation can be evaluated as an error. This effect may be visualized on the basis of the virtual map of the battery by a land surface which is formed, for example, from temperature measured values not being static, but rather deforming with time. The land surface is continuously tracked or corrected by the adaptive adaptation of a respective switching configuration, i.e., a respective pattern of active and passive battery cells, so that its deviation from the predetermined land surface is always minimized. The minimizing of the error can be achieved, for example, by the method of least squares. The advantage thus results that a cell parameter distribution thus produced will always be ideal, i.e., will be as similar as possible to the predetermined cell parameter distribution, in the scope of the secondary conditions restricting it.

Since an adaptive adaptation of a respective switching configuration to changed measurement signals represents a computing-intensive operation, however, one advantageous refinement of the method according to the invention provides that the switching rule prescribes that the control unit activates the switching elements of the battery cells according to a predetermined cycling rule, by which a change is made between at least two switching configurations in a predetermined cycle. In other words, a continuously tracked adaptation of the actually measured distribution function to the predetermined distribution function does not take place, but rather a change is made between at least two switching configurations in a predetermined cycle, so that, for example, in a region of the battery which is located in direct proximity to a device component emitting heat, a change is made between switching configurations as a standard and without continuous checking. Thus, for example, a heat transport within the battery becomes able to be controlled and/or regulated in an advantageous manner.

One advantageous embodiment of the invention provides that the at least one secondary condition is predetermined by an operating mode of the functional device and relates to a minimum power requirement and/or a maximum power requirement of the battery. In other words, it can be provided that a predetermined distribution of a respective cell parameter is to be achieved by producing a switching configuration, wherein it has to be maintained as a secondary condition that for the case in which the functional device is an at least partially electrically driven motor vehicle, a predetermined power is provided to an electric motor of the motor vehicle. A respective operating mode can thus be characterized by a load of the electric motor, i.e., a motor operating mode. Such an operating mode can be, for example, an "eco and boost mode". For example, it can be provided that a motor vehicle is operated at a high velocity, as can be the case, for example, during freeway travel, in the course of which the motor vehicle is regularly controlled at a velocity of 140 km/h or more. Such an operation represents a high power requirement for the battery of the motor vehicle. According to the embodiment described here of the method according to the invention, the battery meets this high power requirement with simultaneous optimal cell parameter distribution, for example, a temperature distribution.

The at least one secondary condition can be predetermined according to a further embodiment by a charging operating mode and can determine a maximization of a charge current. A charging operating mode can be characterized by a charge state of a respective battery cell of the battery. A charging operating mode can be defined in this case such that the highest possible charge current can always flow. Alternatively, a charging operating mode can be defined such that a shortest possible charging time is achieved.

Furthermore, it can be provided that the battery operates a temperature control device, wherein the temperature control device comprises a battery-cell-comprehensive temperature control body, which is designed to accommodate a temperature control medium and have the temperature control medium flow through it. Such a temperature control device can be formed, for example, as a temperature control plate on which the battery cells of the battery are arranged.

According to one advantageous refinement of the method according to the invention, the temperature control body contacts each of the battery cells of the battery for a respective equal proportion for a heat transfer, i.e., thermally, wherein the switching configuration is designed to alternately provide the temperature control medium as it flows through the temperature control device to a battery cell switched to active and a battery cell switched to passive along the through flow direction. A particularly advantageous synergy effect results in this way between the known advantage of the switching capability of the battery cells and the equalizing effect of such a temperature control unit which thermally contacts all battery cells in a respective equal proportion.

According to one advantageous refinement, the temperature control device comprises a central temperature control medium feed point and a central temperature control medium discharge point. In other words, there is only one feed point for temperature control medium and only one discharge point for temperature control medium. The advantage thus results that such a temperature control device is particularly cost-effective to produce and can be installed in the functional device particularly independently of structural space. Only the method according to the invention utilizing switchable battery cells enables such a simply design temperature control device to be used. This is because, since in a particularly advantageous manner, the temperature control medium can alternately flow along battery cells switched to passive and active along its through flow direction, it has the possibility of alternately cooling down and heating up again and again on its path through the temperature control body. Cooled or heated temperature control medium does not have to be fed into the temperature control body repeatedly at various points in order to achieve a desired temperature distribution within the temperature control body. The desired temperature distribution within the temperature control body is instead achieved in cooperation with the switchable battery cells activated according to the method according to the invention.

The invention also relates to a battery which is designed to carry out the method according to one of the preceding claims, and also a functional device having a battery according to the invention.

The invention also includes refinements of the battery according to the invention, which comprise the features as have already been described in conjunction with the refinements of the method according to the invention. For this reason, the corresponding refinements of the battery according to the invention are not described once again here.

The functional device according to the invention is preferably an at least partially electrically driven motor vehicle. The motor vehicle is preferably designed as an automobile, in particular as a passenger vehicle or truck, which has an at least partially electrical drive. The functional device can also be, for example, a stationary accumulator.

The invention also comprises the combinations of the features of the described embodiments.

BRIEF DESCRIPTION OF THE DRAWINGS

Exemplary embodiments of the invention are described hereafter. In the figures.

DETAILED DESCRIPTION

The exemplary embodiments explained hereafter are preferred embodiments of the invention. In the exemplary embodiments, the described components of the embodiments each represent individual features of the invention to be considered independently of one another, which each also refine the invention independently of one another and are thus also to be considered to be a component of the invention individually or in a combination other than that shown. Furthermore, the described embodiments can also be supplemented by further ones of the above-described features of the invention.

In the figures, identical reference signs each identify functionally-identical elements.

Figure 1:
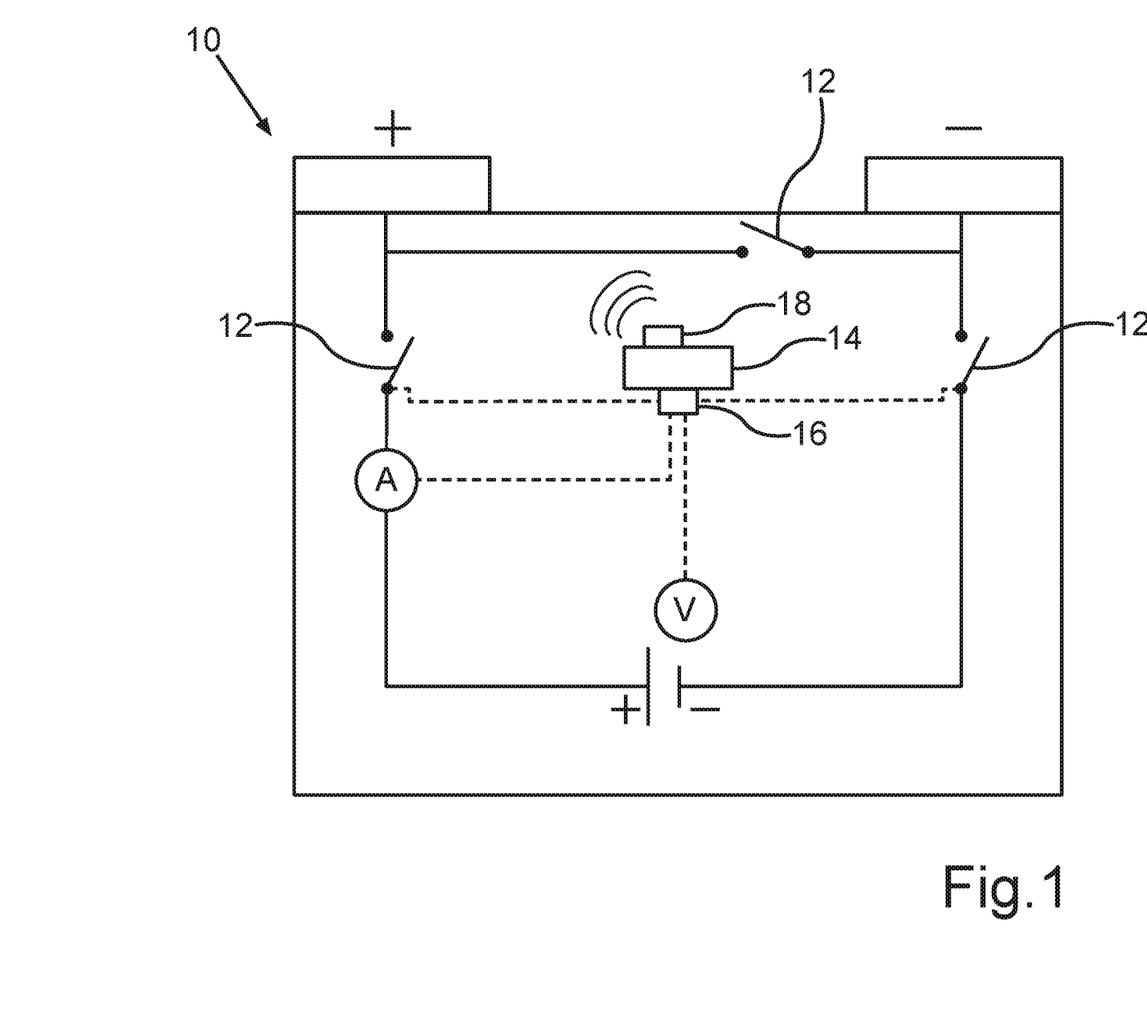
FIG. 1 shows a schematic illustration of a switchable battery cell.

FIG. 1 shows a switchable battery cell 10. The switchable battery cell 10 in the embodiment shown here comprises a total of three switching elements 12. At least one switching element 12 is preferably provided for switching in and switching out the illustrated galvanic cell and one switching element 12 is provided for bypassing the galvanic cell and connecting cell poles of the battery cell 10. In another embodiment, there can therefore be two or a different number of switching elements 12. Furthermore, the battery cell 10 in the embodiment shown here comprises a monitoring unit 14 having a measuring unit 16 and a communication terminal 18. The communication terminal 18 is formed in the exemplary embodiment shown here as a wireless communication terminal. Such a communication terminal can be, for example, a radio terminal or a WLAN terminal (WLAN—wireless local area network).

Figure 2:
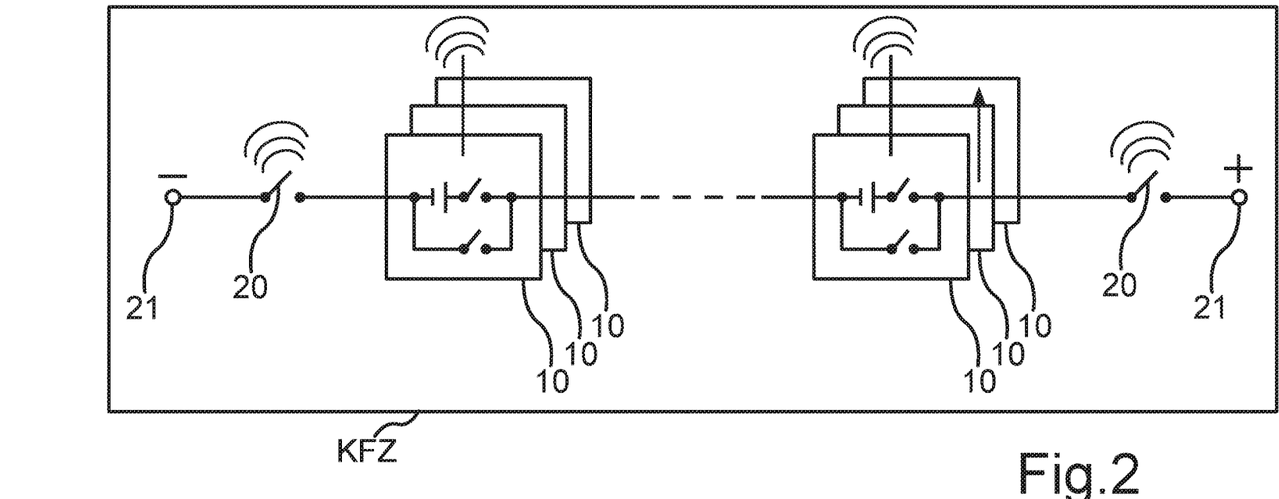
FIG. 2 shows a schematic illustration of a plurality of electrically interconnected switchable battery cells in a functional device, wherein the functional device is an at least partially electrically driven motor vehicle here.

FIG. 2 shows a plurality of electrically interconnected switchable battery cells 10 in a functional device KFZ (Kraftahrzeug=motor vehicle), which can be designed as an at least partially electrically driven motor vehicle. The switchable battery cells 10 shown here comprise the components described in detail in FIG. 1. For the sake of comprehensibility, the components are not individually identified in FIG. 2. The electrically interconnected switchable battery cells 10 in FIG. 2 are electrically connectable via further switching elements 20 to the electrical terminals 21 of the vehicle battery. As shown in FIG. 2, the further switching elements 20 each also have a communication terminal, which is formed in the embodiment shown here as a wireless terminal, for example, as a radio terminal.

Figure 3:
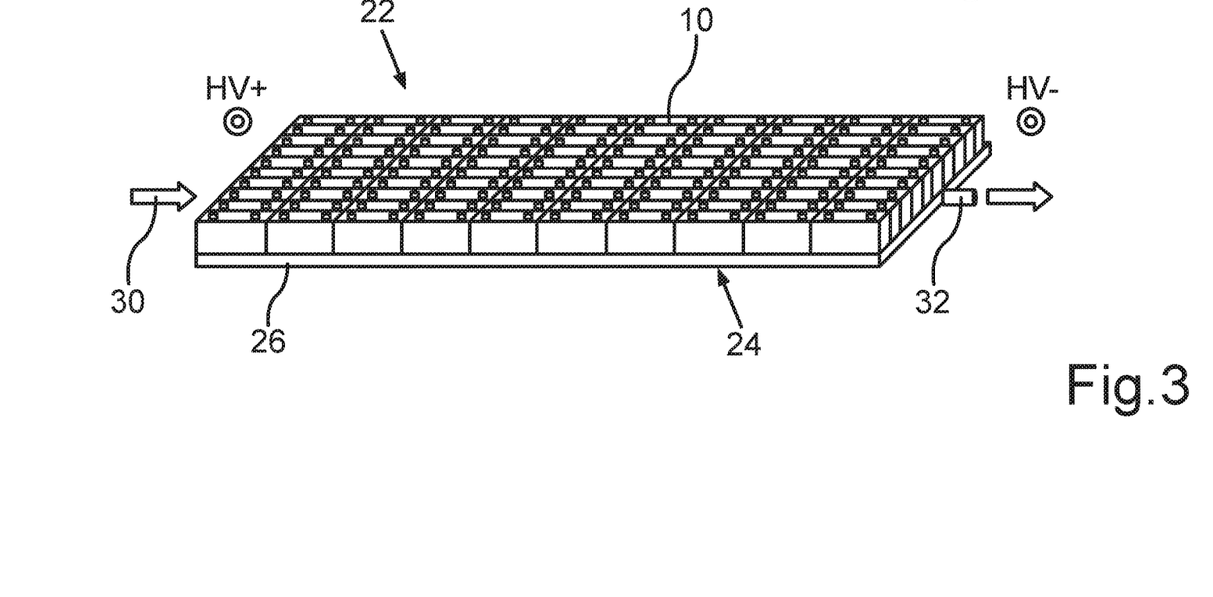
FIG. 3 shows a schematic illustration of a plurality of interconnected switchable battery cells and a temperature control device according to the invention.

FIG. 3 shows a plurality of switchable battery cells 10, which are arranged to form a battery 22. Furthermore, FIG. 3 shows a temperature control device 24, which comprises a battery-cell-comprehensive temperature control body 26. The temperature control body 26 is designed to accommodate a temperature control medium 28 (not shown here). The temperature control body 26 is furthermore designed to have the temperature control medium 28 flow through it freely. FIG. 3 additionally shows a temperature control medium feed point 30 (illustrated by an arrow here). A temperature control medium discharge point 32 is opposite to the temperature control medium feed point 30.

Figure 4:
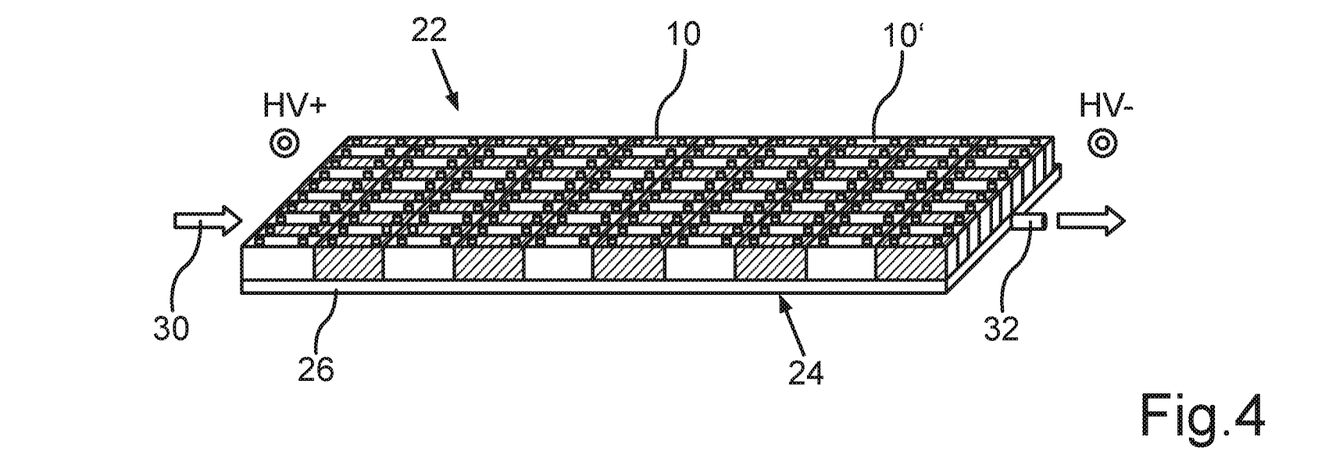
FIG. 4 shows a schematic illustration of a switching configuration according to one embodiment according to the invention.
Figure 5:
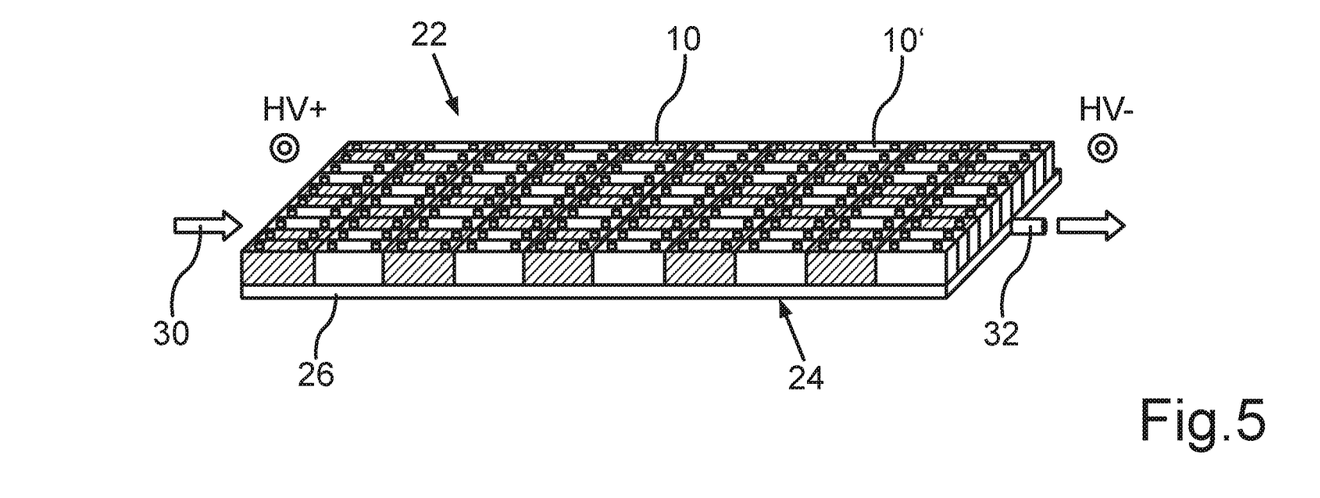
FIG. 5 shows a schematic illustration of a further switching configuration according to one embodiment according to the invention.

FIGS. 4 and 5 each also show a plurality of switchable battery cells 10, wherein the battery cells are respectively arranged to form a battery 22. FIGS. 4 and 5 each also show a temperature control body 26 according to the invention. In contrast to the battery shown in FIG. 3, FIGS. 4 and 5 each show switching configurations 34 of battery cells 10 and 10' alternately switched to active and passive. The switching configuration 34 of FIG. 4 provides that the switchable battery cells 10, 10' are arranged in a chessboard pattern. Thus, one active battery cell 10 and one passive battery cell 10' always alternate. In the embodiment shown here, the entire surface of the temperature control device 24 can particularly advantageously be used to cool and/or heat the battery 22 as a whole, wherein only 50% of the switchable battery cells 10, 10' shown here are switched to active.

A similar effect may be achieved by the embodiment of the switching configuration shown in FIG. 5. Double packs of active and passive switchable battery cells 10, 10' are each alternately arranged adjacent to one another here. The embodiments shown in FIGS. 4 and 5 thus enable a particularly uniform temperature distribution within the entire battery 22. In contrast to the known bank charging, in which in general battery sections are charged section by section, in an arrangement according to FIGS. 4 and/or 5, the entire surface of the temperature control device may be used for cooling, for example, although in each case only 50% of the switchable battery cells 10, 10' are charged. In addition to the very regular switching configurations 34 of FIGS. 4 and 5, any arbitrary arrangement of active and passive switchable battery cells 10, 10' can be produced.

Figure 6:
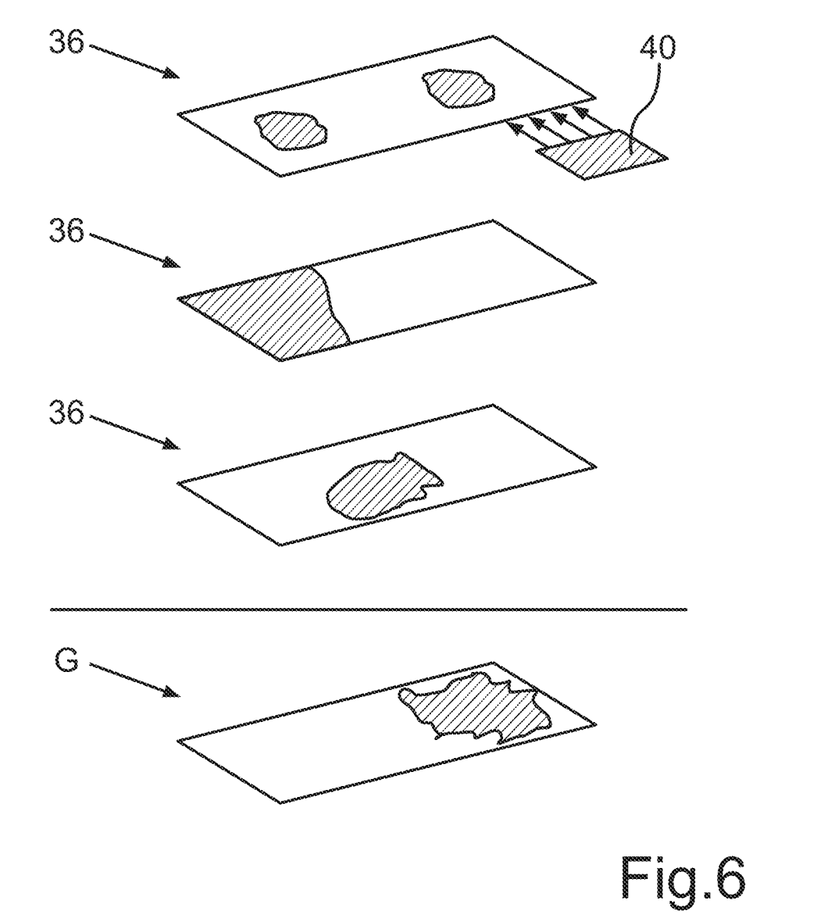
FIG. 6 shows a schematic illustration of location-distributed cell parameters on the basis of multiple virtual map levels.

FIG. 6 schematically shows virtual maps of a battery 22 according to the invention. Each of the maps corresponds in this case to a respective location-resolved distribution function 36. Each of the virtual maps shown here thus illustrates the location-resolved distribution of a respective cell parameter 38. Moreover, in the uppermost map representation of FIG. 6, a heat-emitting component 40 is shown, the heating effect of which can be compensated for by cycling of the switching configuration 34 described according to the invention. If the virtual maps shown in FIG. 6 are laid one on top of another or stacked, a resulting overall distribution function G of the cell parameters shown here thus particularly advantageously results. This resulting overall distribution function G can be adapted to a predetermined target distribution function by the activation according to the invention of the switching elements 12 according to the predetermined switching rule.

Figure 7:
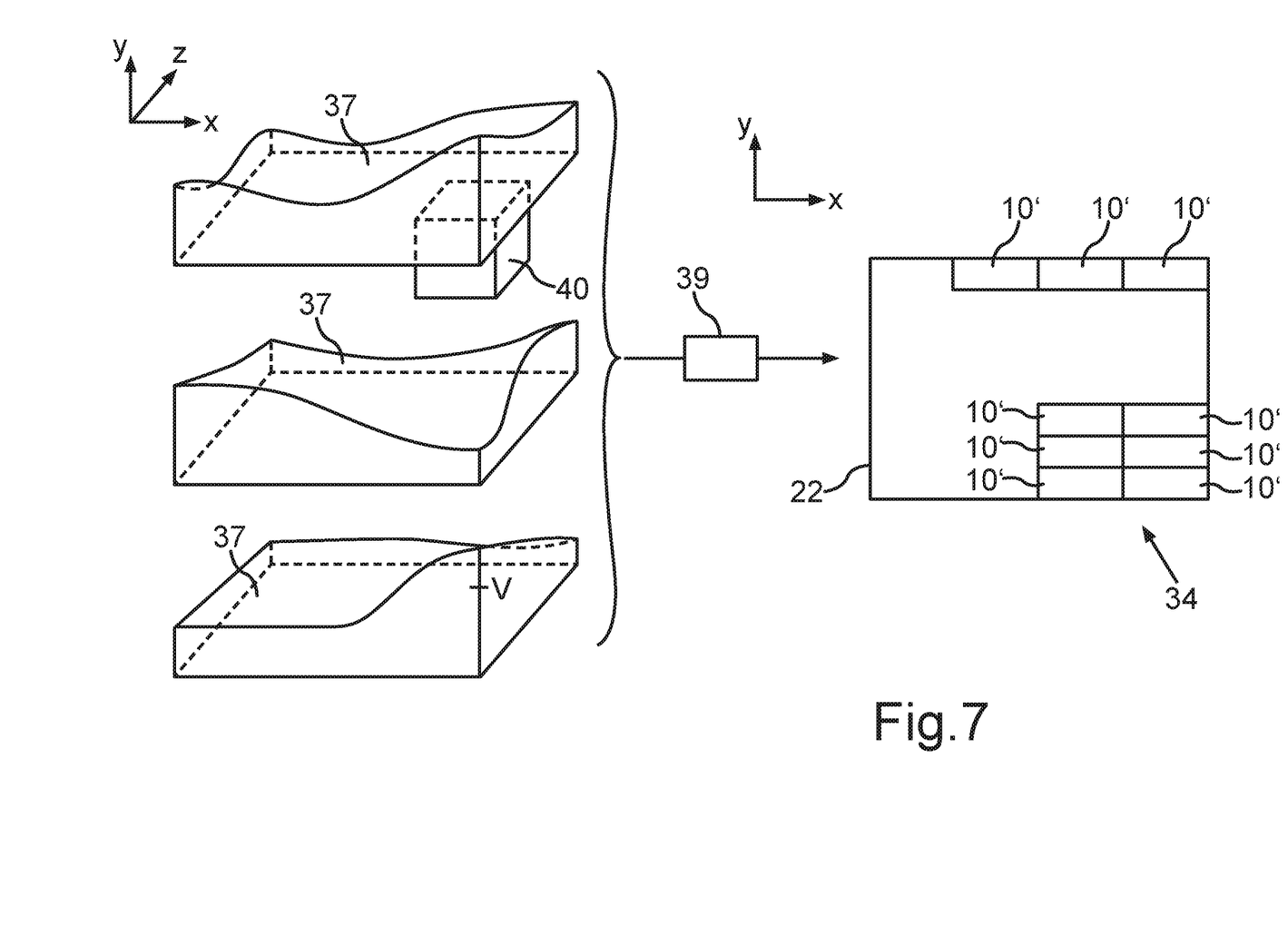
FIG. 7 schematically shows virtual topographic maps in a block diagram representation of a battery according to the invention and a resulting switching configuration.

FIG. 7 illustratively shows schematic virtual topographic maps in block diagram representation of a battery 22 according to the invention. The x and y axis of each block diagram span the footprint of the battery 22 in this case. Values of a respective cell parameter 38 are plotted along the z axis. The land surface 37 of each block diagram corresponds in this case to a respective location-resolved distribution function 36 of the values of a respective cell parameter 38. Each of the virtual land surfaces 37 shown here thus illustrates the location-resolved distribution of the values of a respective cell parameter 38.

In the example shown here, in the uppermost block diagram the cell parameter 38 is a temperature, in the middle block diagram it is a charge state, wherein charge state values can be provided, for example, in percentage of a possible total charge of a respective battery cell 10, 10' and/or as an idle voltage value of a respective battery cell 10, 10', and in the lowermost block diagram a wear state, wherein wear state values can be, for example, wear values of the battery cells 10, 10'. Moreover, a heat-emitting component 40 is also shown in the uppermost block diagram representation of FIG. 7, the heating effect of which can be compensated for by the cycling described according to the invention of the switching configuration 34. If the virtual land surfaces 37 shown in FIG. 7 are laid one on top of another or stacked, a resulting overall distribution function G (not shown here for the sake of comprehensibility) of the cell parameter values 38 illustrated here thus results in a particularly advantageous manner.

The battery cells 10, 10' in the exemplary embodiment shown in FIG. 7 have in summary elevated temperature values, low idle voltage values, and strongly elevated wear values above the heat-emitting component 40. The predetermined target distribution function provides here, for example, that a uniform distribution and a uniform discharge of the battery cells 10, 10', i.e., a uniform charge state, are to be achieved within the battery 22. At the same time, battery cells 10, 10', the wear values of which are above a predetermined limiting value V, are to be switched to passive. As a secondary condition 39, for example, a predetermined power requirement of the functional device KFZ has to be met in this case. In order to at least approximate this target distribution function, a switching configuration 34 of battery cells 10 and 10' switched to active and passive can be produced according to the predetermined switching rule by the activation according to the invention of the switching elements 12. A corresponding switching configuration 34 is schematically shown on the right side in FIG. 7. For the sake of comprehensibility, only battery cells 10' switched to passive are shown here. The remaining region of the battery 22 comprises battery cells 10 switched to active.

Overall, the examples show how an optimum cell parameter distribution can be provided by the invention in a battery in consideration of different secondary conditions by means of switchable battery cells.

A switchable intelligent battery cell which can be bypassed (smart cell) is used as the basis of a specific embodiment. A plurality of such smart cells is electrically interconnected in a battery system, which can be referred to as a smart battery.

Advantages of the method according to the invention and the described embodiments are, inter alia:

Even if, for example, only 50% of 100% smart cells are active, 100% of the cooling system (i.e., the temperature control device) and the cooling surface of the individual smart cells (i.e., the cooling surface thereof) can be utilized 100%. A more homogeneous temperature distribution is thus possible, even if, for example, only 50% of the cells are active.

Optimum temperature distribution+cooling are possible even in the ECO & BOOST mode as a special motor operating mode.

An optimum heat distribution can be achieved.

The interconnection is implementable reasonably even in single P and multiple P systems.

A dynamic adaptation of a respective switching configuration is possible. In this case, arbitrary patterns of active and passive cells can be produced. Battery cells [0 . . . maximum number (for example, 432—C-BEV)] can be switched on and off as desired.

It is possible to switch battery cells on and off (optional cycling) to minimize or shift hotspots, for example (for example, if a hot or heat-emitting component is in the vicinity of the battery and thus a hotspot always prevails). The thermal transport in the battery system can be controlled and/or regulated by the method according to the invention.

In a charging operating mode, 400 V/800 V and/or all voltage levels in between can be represented, wherein the cooling of all battery cells can be optimized at the same time. I.e., for example, when charging by means of a 150/300 kW charging column, the maximum available charging current may thus always be retrieved, which enables an optimization with respect to "derating"/power limiting if the battery system increases the overall battery voltage due to the charging procedure (P=U*I). I.e., if $U_{battery}$ rises and $P_{charging\_column}$ is to remain the same, normally the charging current I thus has to be reduced. $U_{battery}$ is reduced by the method according to the invention if cells can be switched out, for example. The current can thus be elevated again and as a further consequence switching over occurs, which results in a power adaptation.

Charging time can therefore possibly be saved, since the battery cells are operated in an optimum temperature range. (Ultra-)fast charging is thus possibly better implementable. Moreover, a better aging behavior of the battery cells may be achieved, because of better cooling.

The known bank charging at 800 V has the disadvantage, in contrast, that 2×400 V are charged sequentially (en bloc). I.e., only 50% of the cooling surface can reasonably be used and moreover a very high temperature inhomogeneity results.

The invention claimed is:

1. A method for operating a battery of an at least partially electrically operated functional device, comprising: the battery includes multiple electrically interconnected switchable battery cells, wherein each of the switchable battery cells includes at least one switching element for alternately switching to active and switching to passive the respective battery cell and a monitoring unit, wherein the monitoring unit comprises at least one measuring unit for measuring a respective cell parameter, wherein the respective measuring unit transmits a measurement signal relating to the respective cell parameter to the monitoring unit, wherein the monitoring unit relays the respective measurement signal to a control unit of the battery, wherein the control unit receives the respective measurement signal and, based on the respective measurement signals of the battery cells as a whole, prepares a predetermined distribution function of the respective cell parameter, and produces a respective switching configuration for defining battery cells switched to active and passive by activating the at least one switching element of the battery cells according to a predetermined switching rule, wherein the switching rule prescribes that the predetermined distribution function of the respective cell parameter is fulfilled and at least one predetermined secondary condition relating to an operation of the functional device and/or the battery is maintained by producing the respective switching configuration.

2. The method according to claim 1, wherein the control unit adaptively adapts the respective switching configuration according to the predetermined switching rule to a change of the respective measurement signal and in this way an error between the actually measured and the predetermined distribution function is reduced.

3. The method according to claim 1, wherein the switching rule prescribes that the control unit activates the switching elements of the battery cells according to a predetermined cycling rule, by which it changes between at least two switching configurations in a predetermined cycle.

4. The method according to claim 1, wherein the at least one secondary condition is predetermined by an operating mode of the functional device and relates to a minimum power requirement and/or a maximum power requirement of the battery.

5. The method according to claim 1, wherein the at least one secondary condition is predetermined by a charging operating mode and determines a maximization of a charging current.

6. The method according to claim 1, wherein the battery operates a temperature control device, wherein the temperature control device includes a battery-cell-comprehensive temperature control body, which is designed to accommodate a temperature control medium and to have the temperature control medium flow through it.

7. The method according to claim 6, wherein the temperature control body thermally contacts each of the battery cells of the battery for a respectively equal proportion, wherein the switching configuration is designed to alternately provide a battery cell switched to active and one switched to passive along the through flow direction to the temperature control medium as it flows through the temperature control device.

8. The method according to claim 6, wherein the temperature control device includes a central temperature control medium feed point and a central temperature control medium discharge point.

9. A battery, which is designed to carry out a method for operating the battery of an at least partially electrically operated functional device, comprising:

the battery includes multiple electrically interconnected switchable battery cells, wherein each of the switchable battery cells includes at least one switching element for alternately switching to active and switching to passive the respective battery cell and a monitoring unit, wherein the monitoring unit comprises at least one measuring unit for measuring a respective cell parameter, wherein the respective measuring unit transmits a measurement signal relating to the respective cell parameter to the monitoring unit, wherein the monitoring unit relays the respective measurement signal to a control unit of the battery, wherein the control unit receives the respective measurement signal and, based on the respective measurement signals of the battery cells as a whole, prepares a predetermined distribution function of the respective cell parameter, and produces a respective switching configuration for defining battery cells switched to active and passive by activating the at least one switching element of the battery cells according to a predetermined switching rule, wherein the switching rule prescribes that the predetermined distribution function of the respective cell parameter is fulfilled and at least one predetermined secondary condition relating to an operation of the functional device and/or the battery is maintained by producing the respective switching configuration.

* * * * *